(12) United States Patent
Sherohman et al.

(10) Patent No.: US 8,883,548 B2
(45) Date of Patent: *Nov. 11, 2014

(54) DEVELOPMENT OF AN ELECTRONIC DEVICE QUALITY ALUMINUM ANTIMONIDE (ALSB) SEMICONDUCTOR FOR SOLAR CELL APPLICATIONS

(75) Inventors: John W. Sherohman, Livermore, CA (US); Jick Hong Yee, Livermore, CA (US); Arthur W. Combs, III, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 62 days.

This patent is subject to a terminal disclaimer.

(21) Appl. No.: 13/280,164

(22) Filed: Oct. 24, 2011

(65) Prior Publication Data

US 2012/0058595 A1 Mar. 8, 2012

Related U.S. Application Data

(63) Continuation-in-part of application No. 11/305,381, filed on Dec. 16, 2005, now abandoned, and a continuation-in-part of application No. 12/976,994, filed on Dec. 22, 2010, now Pat. No. 8,338,916.

(51) Int. Cl.
*H01L 31/0304* (2006.01)
*H01L 31/073* (2012.01)
(Continued)

(52) U.S. Cl.
CPC ........ *H01L 31/0304* (2013.01); *H01L 31/0296* (2013.01); *H01L 21/02549* (2013.01);
(Continued)

(58) Field of Classification Search
CPC ............ H01L 31/06875; H01L 25/042; H01L 2924/10321; H01L 31/00; H01L 31/0296; H01L 31/02966; H01L 31/0304; H01L 31/03046; H01L 31/035209; H01L 31/035218; H01L 31/036; H01L 31/073; H01L 31/0735; H01L 31/075; H01L 31/184; H01L 31/1864; H01L 31/1844; H01L 2924/10347
USPC ........... 257/E27.123–E27.126, E29.089, 615, 257/E31.033; 438/94, 781
See application file for complete search history.

(56) References Cited

U.S. PATENT DOCUMENTS 4,626,322 A * 12/1986 Switzer .......................... 205/91
4,688,068 A 8/1987 Chaffin et al.
(Continued)

FOREIGN PATENT DOCUMENTS

FR 2800201 4/2001

OTHER PUBLICATIONS

Becerril, M., et al., "Band gap energy in Zn-rich Zn1-xCdxTe thin films grown by r.f. sputtering", Revista Mexicana de Fisica, vol. 50, No. 6, 2004, pp. 588-593.

(Continued)

*Primary Examiner* — Jarrett Stark
*Assistant Examiner* — Bitew Dinke
(74) *Attorney, Agent, or Firm* — John P. Wooldridge (57) ABSTRACT

Electronic device quality Aluminum Antimonide (AlSb)-based single crystals produced by controlled atmospheric annealing are utilized in various configurations for solar cell applications. Like that of a GaAs-based solar cell devices, the AlSb-based solar cell devices as disclosed herein provides direct conversion of solar energy to electrical power.

27 Claims, 7 Drawing Sheets (51) Int. Cl.
  *H01L 31/0296*   (2006.01)
  *H01L 31/18*   (2006.01)
  *H01L 31/0352*   (2006.01)
  *H01L 31/075*   (2012.01)
  *H01L 31/036*   (2006.01)
  *H01L 31/0735*   (2012.01)
  *H01L 21/02*   (2006.01)

(52) U.S. Cl.
  CPC .... *H01L 31/1844* (2013.01); *H01L 31/035209* (2013.01); *H01L 31/1864* (2013.01); *Y02E 10/548* (2013.01); *H01L 31/03046* (2013.01); *H01L 31/184* (2013.01); *H01L 31/075* (2013.01); *H01L 31/02966* (2013.01); *H01L 31/036* (2013.01); *H01L 21/02562* (2013.01); *H01L 31/0735* (2013.01); *Y02E 10/543* (2013.01); *Y02E 10/544* (2013.01); *H01L 21/02398* (2013.01); *H01L 31/035218* (2013.01); *H01L 31/073* (2013.01)
  USPC 438/94; 438/781; 257/E27.123; 257/E27.126; 257/E29.089; 257/E31.033; 257/615

(56) References Cited

U.S. PATENT DOCUMENTS

| | | | |
|---|---|---|---|
| 5,726,462 A * | 3/1998 | Spahn et al. | 257/76 |
| 6,273,969 B1 | 8/2001 | Dutta et al. | |
| 6,274,882 B1 * | 8/2001 | Verie et al. | 257/22 |
| 6,300,558 B1 | 10/2001 | Takamoto et al. | |
| 6,444,894 B1 | 9/2002 | Sterzel | |
| 6,470,125 B1 * | 10/2002 | Nashimoto et al. | 385/122 |
| 6,891,869 B2 | 5/2005 | Augusto | |
| 7,224,041 B1 * | 5/2007 | Sherohman et al. | 257/613 |
| 7,309,393 B2 * | 12/2007 | Sherohman et al. | 117/13 |
| 7,329,568 B2 * | 2/2008 | Kyozuka | 438/151 |
| 7,633,083 B2 * | 12/2009 | Lester et al. | 257/20 |
| 7,635,879 B2 * | 12/2009 | Boos et al. | 257/197 |
| 8,338,916 B2 * | 12/2012 | Sherohman et al. | 257/615 |
| 2002/0070390 A1 * | 6/2002 | Chow | 257/197 |
| 2004/0061063 A1 | 4/2004 | Sherohman et al. | |
| 2004/0065363 A1 | 4/2004 | Fetzer et al. | |
| 2004/0154654 A1 | 8/2004 | Mortenson | |
| 2005/0098096 A1 * | 5/2005 | Sherohman et al. | 117/201 |
| 2005/0145274 A1 | 7/2005 | Polce et al. | |
| 2005/0205001 A1 * | 9/2005 | Sherohman et al. | 117/18 |
| 2006/0162768 A1 | 7/2006 | Wanlass | |
| 2006/0189156 A1 * | 8/2006 | Doczy et al. | 438/778 |
| 2007/0131161 A1 * | 6/2007 | Sherohman et al. | 117/108 |
| 2007/0137700 A1 * | 6/2007 | Sherohman et al. | 136/262 |
| 2008/0206966 A1 * | 8/2008 | Huffaker et al. | 438/479 |
| 2011/0147589 A1 * | 6/2011 | Lordi et al. | 250/336.1 |

OTHER PUBLICATIONS

Biefeld, R., "The metal-organic chemical vapor deposition and properties of III-V antimony-based semiconductor materials", Materials Science and Engineering, R36, 2002, pp. 105-142.

Bracker, A., et al., "Stoichiometry-induced roughness on antimonide growth surfaces", Applied Physics Letters, vol. 78, No. 17, 2001, pp. 2440-2442.

Burnett, B., "The Basic Physics and Design of III-V Multijunction Solar Cells", US National Renewable Energy Laboratory (NREL), 2002.

Hirano, H., et al., "High-pressure phase transitions in AlSb", Journal of Physics and Chemistry Solids, 62, 2001, pp. 941-949.

Kroemer, H., The 6.1 Å family (InAs, GaSb, AlSb), and its hetrostructures: a selective review, Physica, E 20, 2004, pp. 196-203.

Kutny, V.E., et al., "AlSb single-crystal grown by HPBM", Nuclear Instruments and Methods in Physics Research, A 458, 2001, pp. 448-454.

* cited by examiner

DEVELOPMENT OF AN ELECTRONIC DEVICE QUALITY ALUMINUM ANTIMONIDE (ALSB) SEMICONDUCTOR FOR SOLAR CELL APPLICATIONS

CROSS-REFERENCE TO RELATED APPLICATIONS

This application is a continuation-in-part of U.S. application Ser. No. 11/305,381, titled "Development of an Electronic Device Quality Aluminum Antimonide (AlSb) Semiconductor For Solar Cell Applications" filed Dec. 16, 2005, now abandoned incorporated herein by reference. This application is also a continuation-in-part of U.S. application Ser. No. 12/976,994, titled "Thermal Oxidation of Single Crystal Aluminum Antimonide and Materials Having the Same" filed Dec. 22, 2010, now U.S. Pat. No. 8,338,916 incorporated herein by reference.

STATEMENT REGARDING FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

1. Field of the Invention

The present invention relates to semiconductors. More specifically, the present invention relates to semiconductor structures that include Aluminum Antimonide (AlSb) and lattice matched solid solution semiconductor materials so as to produce solar cells.

2. Description of Related Art

Solar cells or photovoltaics (PV) manufactured from semiconductor materials are based on absorbing photons of light so as to promote valence electrons of the semiconductor to the conduction band to enable such electrons to move freely through the semiconductor. At the same time, the holes left by the yielded electrons can jump from core to core, thus forming positive charge carriers which can also move easily through the valence band of the semiconductor material. Such a mechanism thus generates electron-hole pairs so as to produce a current that can be harvested to charge batteries, operate motors, and to power a wide variety of electrical loads.

Because of the concerns over limited resources, efforts have been ongoing to increase the output and/or the efficiency of PV cells. One such arrangement includes stacking materials to create multi-junctions (grouping a predetermined number, often greater than about 2, different p-n junction semiconductor materials) so that predetermined materials having different energy bandgaps can absorb a different part of the energy distribution from the sun. In such an arrangement, the top layers absorb higher-energy photons, while transmitted lower-energy photons are absorbed by the lower layers of the configured device. Background information for such devices is described and claimed in U.S. Pat. No. 6,891,869 B2, entitled "Wavelength-Selective Photonics Device," issued May 10, 2005 to Augusto, including the following, "A device comprising a number of different wavelength-selective active-layers arranged in a vertical stack, having band-alignment and work-function engineered lateral contacts to said active-layers, consisting of a contact-insulator and a conductor-insulator. Photons of different energies are selectively absorbed in or emitted by the active-layers. Contact means are arranged separately on the lateral sides of each layer or set of layers having the same parameters for extracting charge carriers generated in the photon-absorbing layers and/or injecting charge carriers in the top photon-emitting layers. The device can be used for various applications: wavelength-selective multi-spectral solid-state displays, image-sensors, light-valves, light-emitters, etc. It can also be used for multiple-band gap solar-cells. The architecture of the device can be adapted to produce coherent light."

In addition, solar cells, such as, GaAs (a=5.6533 Å) and Ge (a=5.6575 Å) stacked devices have been arranged in lattice matched configurations (lattice mismatch is on the order of 0.074%) so as to minimize surface dislocations, i.e., crystal defects at the interface of the stacked layers. The presence of such crystal defects reduces the minority-carrier lifetimes in the bulk of the layers, increases the surface recombination velocity at interfaces and creates possible shunting paths, all of which can reduce the efficiency of PV devices, and in general, degrade device performance. Further, multi-junction solar cells and other optoelectronic devices having these crystal defects degrade under radiation.

Background information for perfectly lattice-matched (PLM) semiconductor layers is described in U.S. Pat. No. 6,586,669 B2, entitled "Lattice-Matched Semiconductor Materials for Use in Electronic or Optoelectronic Devices," issued Jul. 1, 2003 to King, et al, including: "In this context, PLM means that the lattice mismatch between the PLM cell and growth substrate is less than 0.074%. If specified, PLM may also refer to a difference in lattice mismatch between the PLM cell and an adjacent cell of less than 0.074%." Such lattice mismatching is emphasized in a 2005 Solar Energy article by M. Yamaguchi et al, entitled, "Multi-junction III-V solar cells: current status and future potential," by the following: "Although 0.08% lattice-mismatch between GaAs and Ge was thought to be negligibly small, misfit-dislocations were generated in thick GaAs layers and deteriorated cell performance."

However, in the context of solar cell performance, it is reported by Burnett in a 2002 document entitled, 'The Basic Physics and Design of Multijunction Solar Cells" that "work at NREL showed that lattice mismatching as low as ±0.01% causes significant degradation of photovoltaic quality." It is, therefore, very important in multi-junction solar cell operation to use semiconductor compositions that are latticed matched.

Such multi-junction lattice matched cell layers can be stacked mechanically or the layers can be grown monolithically, typically by metal-organic vapor phase epitaxy (MOVPE) or molecular beam epitaxy (MBE). Background information on similar lattice matched devices can be found in U.S. Pat. No. 6,300,558 B1, entitled "The present invention relates to a high efficiency solar cell that can be used as an energy source of an artificial satellite, etc. and, more particularly, a lattice matched solar cell using group III-V compound semiconductor, epitaxially grown on a germanium (Ge) substrate, and a method for manufacturing the same."

Accordingly, a need exists for solar cell configurations that include controlled atmospherically annealed high purity AlSb single crystals so as to efficiently couple the sun's energy distribution. The present invention is directed to such a need.

SUMMARY OF THE INVENTION

Accordingly, the present invention provides a controlled atmospheric annealed single crystal AlSb substrate host layer material coupled to one or more solid-solution semiconductor materials, wherein each of the one or more solid-solution semiconductor materials further include a lattice parameter so as to produce a substantially lattice-matched configuration.

Another aspect of the present invention is to provide homojunction solar cell configured from a controlled atmospheric annealed single crystal AlSb material.

A further aspect of the present invention is to provide a method of forming a homojunction solar cell that includes: providing high-purity single crystal ingots of AlSb; forming one or more wafers from the high-purity single crystal ingots; providing controlled atmospheric annealing of the single crystal wafers to adjust the stoichiometry; positioning dopants in the wafers so as to form predetermined p-n junctions; surface passivating the single crystal wafers, e.g., using an oxide layer; forming contacts on predetermined regions of the solar cell; and utilizing antireflection technologies and packaging to provide a final product.

Another aspect of the present invention is to provide a method for producing a solar cell that includes: providing a controlled atmospheric annealed single crystal AlSb substrate; wherein the AlSb substrate is configured as an active host layer; and coupling one or more solid-solution semiconductor materials with the controlled atmospheric annealed single crystal AlSb active host layer, wherein each of the one or more solid-solution semiconductor materials further include a lattice parameter so as to produce a substantially lattice-matched configuration.

Another aspect of the present invention is to provide a method for producing a solar cell. A first step heat treats an AlSb crystal in a partial vacuum atmosphere at a temperature conducive for air adsorbed molecules to desorb, surface molecule groups to decompose, and elemental Sb to evaporate from a surface of the AlSb crystal. Another step exposes the AlSb crystal to an atmosphere comprising oxygen to form a crystalline oxide layer on the surface of the AlSb crystal. Another step removes areas of the oxide layer surface from the AlSb host crystal for coupling conductive material contacts or coupling more solid-solution semiconductor materials.

Another aspect of the present invention is to provide another method for producing a solar cell. A step heat treats an AlSb crystal in a non-oxidizing atmosphere at a temperature conducive for decomposition of an amorphous oxidized surface layer and evaporation of elemental Sb from a surface of the AlSb crystal. Another step forms stable oxides of Al and Sb from residual surface oxygen to form a crystalline oxide layer on the surface of the AlSb crystal. Another step removes areas of the oxide layer surface from the AlSb host crystal for coupling conductive material contacts or coupling more solid-solution semiconductor materials.

Accordingly, the present invention provides a controlled atmospheric annealed AlSb single crystal arranged as an active host material for use as a solar cell in arrangements that includes, homojunctions, heterojunctions, multi-junctions, quantum wells, and quantum dot structures. Such AlSb-based solar cell devices can be used in terrestrial solar cell applications. Moreover, because of the high energy band-gap of the AlSb material of the present invention, AlSb-based solar cell devices can also be utilized in concentrator solar cell applications

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

Referring now to the following detailed information, and to incorporated materials; a detailed description of the invention, including specific embodiments, is presented. The detailed description serves to explain the principles of the invention.

Unless otherwise indicated, all numbers expressing quantities of ingredients, constituents, reaction conditions and so forth used in the specification and claims are to be understood as being modified in all instances by the term "about". Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical value, however, inherently contain certain errors necessarily resulting from the standard deviation found in their respective testing measurements.

Figure 1:
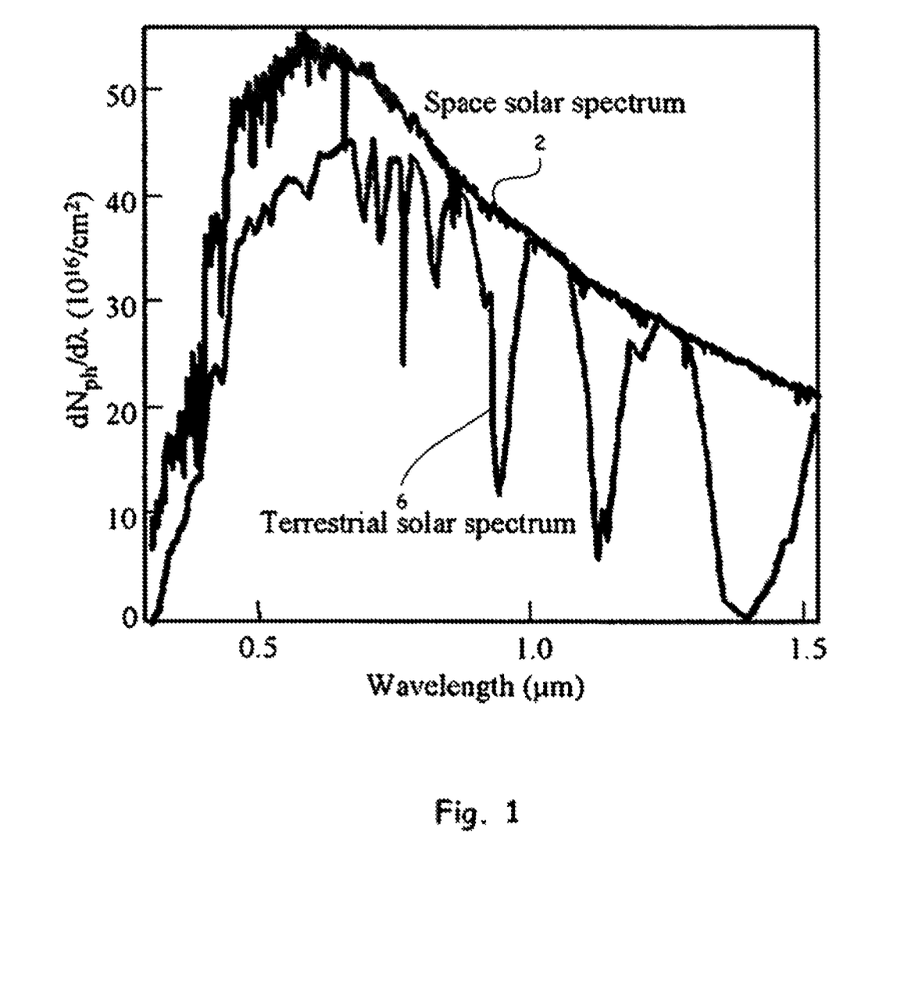
FIG. 1 shows the space solar spectrum of the sun's light above the Earth's upper atmosphere and the terrestrial solar spectrum as received on Earth.

FIG. 1 shows the space solar spectrum 2 of the sun's light above the Earth's upper atmosphere and the terrestrial solar spectrum 6, as received on Earth. As indicated, the solar spectrum peak region is from about 0.4 µm to about 0.7 µm, which shows that photons in the visible and surrounding regions are emitted more than any other part of the sun's electromagnetic spectrum. FIG. 1 also shows that there are a large number of photons in the infrared region from 0.7 to 10 µm and that very little light from the sun contains wavelengths shorter than 0.3 µm (i.e., photon energy greater than about 4 eV). The difference in the space 2 and terrestrial 6 solar spectra, as shown in FIG. 1, is due to photons being absorbed by atmospheric gases such as ozone ($O_3$), which absorbs higher-energy light below 0.4 μm) and water vapor (photons with wavelengths near 0.9, 1.1, and 1.4 μm). The solar conversion efficiency for any material is therefore greatest for photon energies equal to its bandgap. For the terrestrial solar spectrum 6, the optimal band gap for solar energy conversion is about 1.5 eV. The optimal bandgap for the space solar spectrum 2, is about 1.6 eV, i.e., about the 1.62 eV indirect bandgap of AlSb.

Like Si and Ge, AlSb has an indirect energy band gap. Like GaAs, the energy band gap (Eg) of AlSb at 1.62 eV, provides for a very good power match to the solar spectrum. Consequently, AlSb represents a semiconductor that can have the favorable solar cell qualities of Si (i.e., indirect Eg, implying long free carrier lifetimes and carrier generation well below the surface) and the favorable solar cell quality of GaAs (i.e., high Eg, providing good power matching for efficient solar energy conversion). Because its energy bandgap is slightly higher than GaAs, AlSb also has a good terrestrial solar spectrum power match. However, in space, the power match of AlSb to the solar spectrum is very good, representing, theoretically, near maximum solar energy conversion efficiency. An AlSb concentrator solar cell, due to its higher energy bandgap, has the potential to operate at higher solar conversion efficiency than a GaAs concentrator solar cell. Likewise, because of its indirect energy bandgap and the potential to have free carrier recombination loses on the order of Si, high temperature operation of AlSb would reduce the amount of solar cell surface required of Si to produce an equivalent power output.

With respect to depth of penetration for received photons (i.e., absorption depth), for direct bandgap semiconductors, such as, GaAs, photon absorption takes place very close to the surface. Due to its direct energy bandgap, the GaAs intrinsic absorption coefficient rises sharply with photon energy, which causes free carrier generation to occur within several microns of the surface. In addition, the direct energy bandgap results in the electron and hole carriers having very short lifetimes (nanoseconds). This combination of very short lifetimes and near surface generation can lead to the loss of free carriers by bulk and surface recombination. To produce a high efficient GaAs solar cell, the thickness of the cell is made very thin (shallow junction depth of 0.5 microns or less) and the surface must be very clean to minimize surface recombination states, which arise from "dangling bonds," chemical residues, metal precipitates, native oxides, and the like.

Photon absorption in indirect semiconductors, such as, Si, may extend into the bulk at distances reaching 100 μm or more before full absorption. Consequently, like Si, which is an indirect bandgap semiconductor, a solar cell of AlSb requires thicker material for photon absorption than direct bandgap semiconductors, e.g., GaAs. This means that electron-hole pairs generated by photons absorbed deep in AlSb will be collected in the bulk crystal when they reach the depletion region of the p-n junction solar cell. It is important, therefore, that an indirect bandgap semiconductor solar cell is of high quality (carrier recombination is minimized) to obtain high solar energy conversion.

The present invention provides such a high quality AlSb solar cell that includes processing high purity as-grown AlSb single crystals that are stoichiometrically controlled using a multiphase atmospheric annealing heat treatment. Such an atmospheric controlled annealing heat treatment enhances the quality of the as-grown crystals by decreasing the intrinsic native defect concentration and thereby extending the lifetime of the carriers to values expected of indirect bandgap material such as Si and Ge. By utilizing such a treatment process, electronic device quality single crystals of AlSb are produced to form solar cell devices for efficient capitalization of the sun's space and terrestrial solar energy spectra, as shown in FIG. 1.

The AlSb single crystal active host substrate as disclosed herein, which can be arranged with a substantially uniform low resistivity (p) of often less than about 10 Ω·cm by doping methods known to one of ordinary skill in the art during the growth process (as measured over the entire produced substrate at room temperature (300K°)), are often produced by a Czochralski (CZ) growth technique. However, other growth methods such as, but not limited to, a Traveling Heating Method (THM), capable of producing quality crystals may also be employed. A detailed disclosure of producing similar high-quality single crystal materials using controlled atmospheric annealing is described in U.S. Pat. No. 6,887,441 B2, titled "High Resistivity Aluminum Antimonide Radiation Detector" by Sherohman et al., assigned to the assignee of the present invention, the disclosure herein incorporated by reference in its entirety. Moreover, the controlled atmospheric annealed single crystal materials, as disclosed herein, can include a beneficial thermal oxide passivation layer having oxides of predominantly aluminum and antimony and a buffer layer can also be designed into the present invention to provide electrical isolation and/or surface smoothing.

The arrangements disclosed herein, in addition to homojunction devices, include stacked materials configured as heterojunction devices, i.e., where the junction is formed by contacting two different semiconductors or as a multijunction device, i.e., a stack of individual single-junction cells in descending order of bandgap (Eg), wherein the top cell captures the high-energy photons and passes the rest of the photons on to be absorbed by lower-bandgap cells. In addition, other arrangements disclosed herein, include heterostructure quantum well and quantum dot solar cell devices. Such multijunction and heterostructure cell arrangements as disclosed herein, can include one or more thin layers of solid solutions greater than 10 Å, often between about 10 Å and up to about 2 μm, of the following materials, such as, but not limited to, Aluminum Antimonide (AlSb), Gallium Antimonide (GaSb), Indium Antimonide (InSb), Indium Arsenide (InAs), Zinc Telluride (ZnTe), and Cadmium Telluride (CdTe) in addition to binary compounds and/or related ternary and quaternary alloys of such materials. For example, given a selected energy bandgap goal, a solid solution formed from AlSb, GaSb, and InSb can be achieved to provide a lattice match to AlSb to less than about 0.01%. Similarly, a higher energy bandgap than AlSb can be obtained with a solid solution of ZnTe and CdTe that provides a lattice match to AlSb to less than about 0.01%.

Such a single crystal material and variations thereof of the present invention is thus beneficial in the design and fabrication of solar cell devices, such as, but not limited to, single-junction solar cells (e.g., homojunction and heterojunction), active host substrates for multijunction solar cell devices, and active host substrates for lattice matched 6.1-Å family heterostructure quantum well and quantum dot solar cell devices so as to efficiently capitalize on the sun's emitted solar spectra, as shown in FIG. 1.

A basic solar cell includes a junction formed between n-type and p-type semiconductors, either of the same material (homojunction), or two different materials (heterojunction). Like silicon, AlSb can be doped to form both p-type and n-type material to create a homojunction. Likewise, p-type or n-type AlSb can be used with another doped semiconductor to create a heterojunction. Similarly, like GaAs, AlSb can be layered by other lattice matched semiconductor materials to form multi-junction solar cells, including both quantum well and quantum dot heterostructure solar cells. AlSb type solar cell devices can be used in non-concentrated and solar concentrated solar cell applications, both terrestrially and in space.

Homojunction Device

Figure 2A:
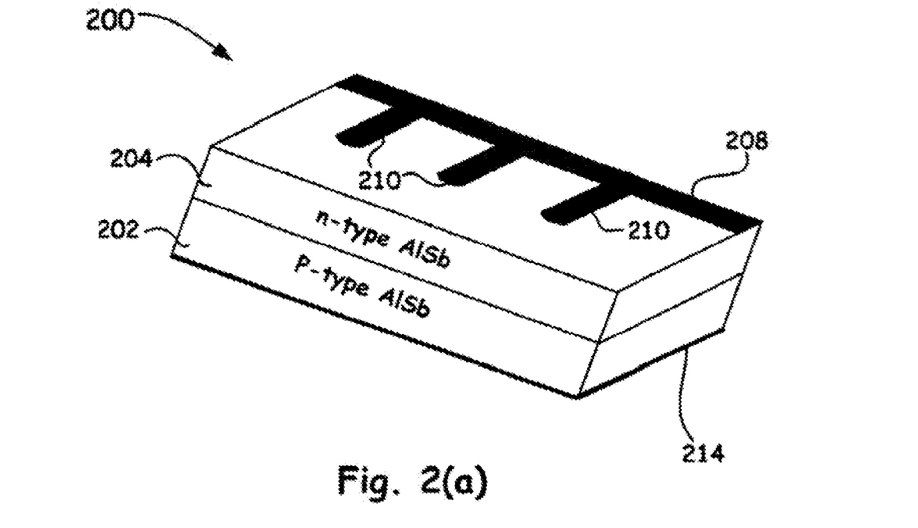
FIG. 2(a) illustrates a basic example p-n homojunction solar cell of the present invention.

FIG. 2(a) shows a basic example p-n homojunction solar cell of the present invention and generally designated by the reference numeral 200, which can include as one embodiment, a p-type AlSb material 202, an n-type AlSb material 204, a front ohmic contact stripe 208 coupled to ohmic fingers 210, and a back ohmic contact 214. In addition to having applied anti-reflection coatings on solar energy receiving surfaces (e.g., material 204) to increase efficiency, design parameters, such as, but not limited to, increasing the depth of the p-n junction below a cell's surface, and varying the amount and distribution of dopant atoms by methods known to one of ordinary skill in the art on either side of a predetermined p-n junction(s), in addition to producing a substantially pure AlSb single crystal of the cell are capable of being altered so as to also increase the overall conversion efficiency of solar cell embodiments of the present invention.

An example method of forming such a high-efficient AlSb homojunction solar cell, similar to that shown in FIG. 2(a), which can be constructed to principles of the present invention, includes: growing p- or n-type high-purity single crystal ingots of AlSb; slicing the ingots to form wafers; annealing such single crystal wafers to adjust the stoichiometry; forming predetermined p-n junctions in the wafers by positioning dopants using methods known to those of ordinary skill in the art of semiconductor doping to form p- or n-type single crystals (e.g., for a p-type wafer, an element is chosen that will form n-type AlSb and for an n-type wafer, an element is chosen that will form p-type AlSb); surface passivating the wafers, e.g., by forming an oxide layer during one or more heat treatments; forming contacts on both the p-type and n-type regions of the cell using known state of the art methods; and by utilizing antireflection technologies and packaging to provide a final product.

Heterojunction Device

A heterojunction solar cell includes two different semiconductors forming a p-n junction. An advantage exists in the heterojunction cell over a homojunction cell if the top layer semiconductor has a larger bandgap than the bottom semiconductor. In this case, photons with energy at or greater than the top bandgap are largely absorbed by the top semiconductor. For lower energy photons, the top semiconductor is a "window" to the bottom semiconductor. The bottom semiconductor absorbs the lower energy photons as determined by its bandgap. The approach of forming a heterojunction solar cell enhances the short wavelength response.

Figure 2B:
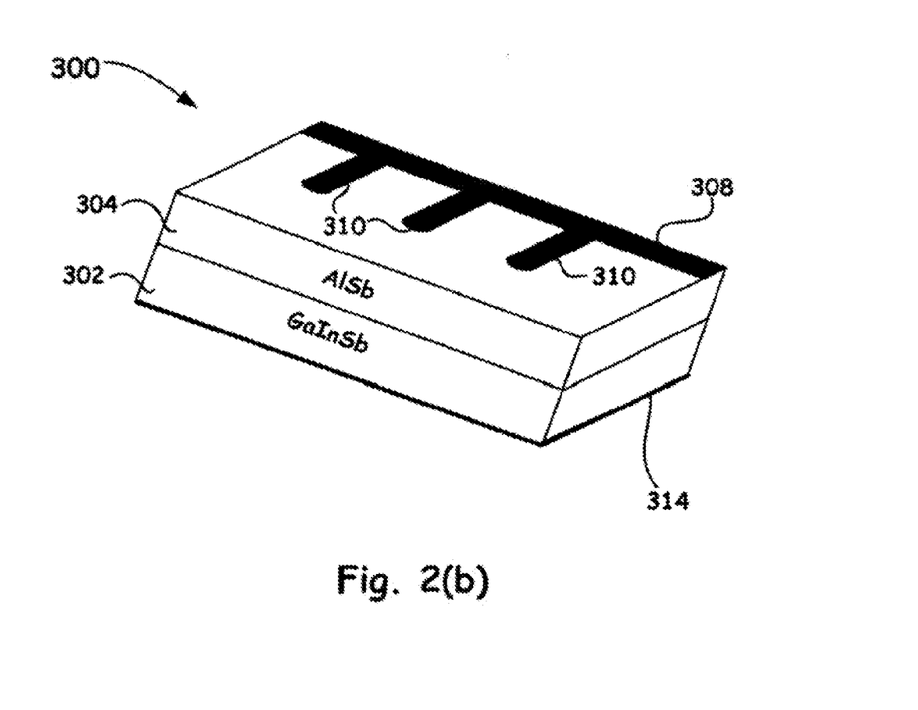
FIG. 2(b) illustrates heterostructure device of the present invention having an AlSb host layer coupled to a lattice matched III-V semiconductor.

The main difficulty of a heterojunction solar cell is using semiconductors that have a good lattice match. As discussed above in the background materials, a two cell layer arrangement having GaAs (a=5.653 Å) configured as the top semiconductor with Ge (a=5.660 Å) as the bottom semiconductor provides a very good lattice match at 0.074%. However, as reported by Burnett in a 2002 document entitled, 'The Basic Physics and Design of Multijunction Solar Cells", research at NREL showed that lattice mismatching as low as ±0.01% causes significant degradation of photovoltaic quality of the solar cell. Likewise, in the present invention, as shown in FIG. 2(b), an AlSb heterojunction device, generally designated as reference numeral 300, can be fabricated using substantially lattice matched materials (i.e., less than about a 0.01% lattice mismatch), such as, for example, using p- or n-type $Ga_{1-x}In_xSb$ as the bottom semiconductor 302 and n- or p-type AlSb as the top layer 304. For illustration purposes, by adding about 10% InSb to GaSb, the compound $Ga_{0.90}In_{0.10}Sb$ can be latticed matched to the AlSb layer. The bandgap of such a compound is about 0.63 eV.

In the heterojunction device, a tunnel junction to reduce interconnection loss (reduce both optical and electrical power loss) may be used to increase the solar cell efficiency between the AlSb and $Ga_{0.90}In_{0.10}Sb$ layer. Similar to the homojunction device 200, as shown in FIG. 2(a), a front ohmic contact stripe 308 coupled to ohmic fingers 310, and a back ohmic contact 314 in addition to having applied anti-reflection coatings (not shown) on solar energy receiving surfaces (e.g., material 304) are also capable of being configured with heterojunction device 300 so as to respectively provide circuit contacts for predetermined loads and to increase efficiency.

Multi-Junction Solar Cell

Multi-junction solar cells or tandem cells of the present invention include layers of predetermined semiconductors stacked on top of each other with decreasing bandgaps. Each cell layer is able to convert a different wavelength of the light spectrum into electricity. The top layers absorb higher-energy photons, while transmitting lower-energy photons to be absorbed by the lower layers of the cell. The multi-junction cell layers can be stacked mechanically or the layers can be grown monolithically. In the monolithic approach, one complete solar cell is made first, and then the layers for the other cells are grown or deposited typically by epitaxial growth methods, more often by metal-organic vapor phase epitaxy (MOVPE) or molecular beam epitaxy (MBE), growth methods that are well known and understood by those of ordinary skill in the art. Such a process forms the multijunction layered solar cell structure.

To achieve high conversion efficiency it is required that these layered semiconductors are substantially "lattice matched" to less than about 0.01% of a predetermined material's lattice parameter. Latticed matched layers significantly reduce surface dislocation defects in the crystal structure, which can impede cell performance. Another "matching" criterion in such devices is to "current match" such layers. Because each layer has a different rate of photon absorption, the thickness of each layer is optimized to ensure each layer, which is series connected, generates the same amount of electrical current.

As in the case of the heterostructure shown in FIG. 2(b), the top layer 304 and the bottom layer 302 can be individual single-junction cells (i.e., each layer having its own p-n junction) representing a two junction solar cell. The two-junction solar cell, generally designated as reference numeral 300 in FIG. 2(b), can be fabricated using substantially lattice matched materials (i.e., less than about a 0.01% lattice mismatch), such as, for example, a layer of $Ga_{0.90}In_{0.10}Sb$ as the bottom cell 302 and AlSb as the top layer cell 304.

Figure 3A:
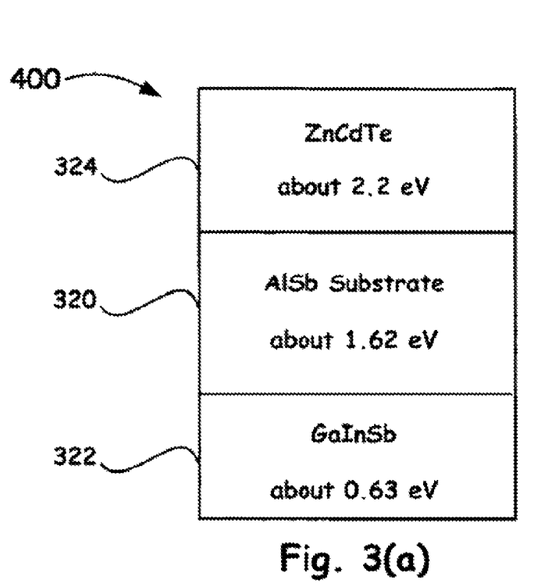
FIG. 3(a) illustrates an example lattice matched three layer solar cell.

For illustration purposes, FIG. 3(a) shows an example three layer solar cell of the present invention, generally designated by the reference numeral 400, which includes an. AlSb single crystal wafer host cell wafer 320 sandwiched between a substantially lattice matched GaInSb cell layer 322 (e.g., $Ga_{0.90}In_{0.10}Sb$) and a substantially lattice matched ZnCdTe layer 324. In the case of the substantially lattice matched ZnCdTe layer 324, about 10% CdTe can be added to ZnTe to form, for example, a $Zn_{0.90}Cd_{0.10}Te$ compound having a band gap of about 2.2 eV. In constructing such an example three layer multi-junction solar cell 400, the lattice matched GaInSb cell layer 322 is deposited on the AlSb host cell wafer 320, e.g., by MBE, so as to form the bottom layer. Subsequently, AlSb host cell wafer 320 can be turned over with lattice matched p- or n-type ZnCdTe 324 deposited as the top layer to form a heterostucture with the p- or n-type side of the p-n junction of the AlSb host cell wafer 320.

Alternatively, the latticed match ZnCdTe 324, if deposited as a p-n junction layer, could be an individual single junction cell top layer. The result is a three layer solar cell with bandgaps of about 2.2 eV (bandgap at 300° K) for the lattice matched ZnCdTe (direct bandgap) layer, about 1.62 eV for AlSb (indirect bandgap) and about 0.63 eV for the lattice matched GaInSb (direct bandgap) layer. Since such layers are lattice matched to AlSb and all have the zincblende crystal structure, this multi-layer device is expected to have a solar concentrator conversion efficiency as high as or greater than currently utilized GaInP/GaAs/Ge devices. As in the case of GaInP/GaAs/Ge solar devices, tunnel junctions may be used between the ZnCdTe/AlSb/GaInSb layers to increase the solar cell efficiency by reducing interconnection losses. In addition, similar to the devices as discussed above in FIGS. 2(*a*) and 2(*b*), the example device as shown in FIG. 3(*a*) may have applied anti-reflection coatings (not shown) but may also contain metal contact layers (not shown) on any of the layers so as to utilize the produced electricity.

Figure 3B:
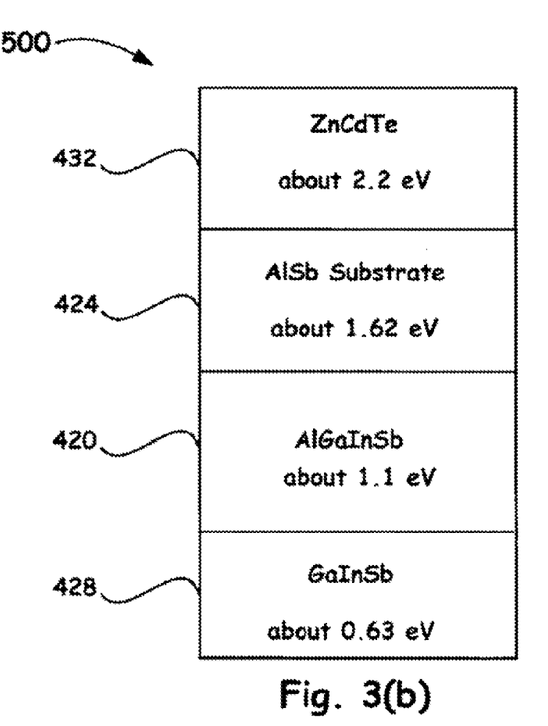
FIG. 3(b) illustrates an example of a lattice matched four layer solar cell device whereby an AlGaInSb compositional layer is used to provide a predetermined intermediate bandgap.

FIG. 3(*b*) shows another exemplary novel solar cell multi-layer device, generally designated by the reference numeral 500, using single crystal AlSb material as part of the configuration. Since solid solutions can be formed between AlSb, GaSb, and InSb, a quarternary compound lattice matched to AlSb can be made for example, by molecular beam epitaxy (MBE) deposition with a bandgap of about 1.1 eV. Such a beneficial material includes, for example, an AlGaInSb semiconductor 420, such as, for example, a quarternary composition of about $Al_{0.50}Ga_{0.45}In_{0.05}Sb$ that is lattice matched to AlSb by methods of the present invention. Such a lattice matched quarternary compound is often beneficially placed between an AlSb layer 424 and the lattice matched GaInSb layer 428. On the other side of the AlSb 424 wafer substrate is the lattice matched ZnCdTe semiconductor material 432, as discussed above. Once again, the example device as shown in FIG. 3(*b*) may have tunnel junctions between the layers to increase the solar cell efficiency by reducing interconnection losses. Also, the example device shown in FIG. 3(*b*) may have applied anti-reflection coatings (not shown) but may also contain metal contact layers (not shown) on any of the layers so as to utilize the produced electricity.

Quantum Well Devices

It is known to one of ordinary skill in the art that quantum wells can be added to a single bandgap p-n junction solar cell. Generally, if the charge carrier in a solid is confined to a semiconductor layer, e.g., 6.1 Angstrom family III-V semiconductor heterostructures of the present invention as discussed above, having a thickness of the order of the de Broglie wavelength of elementary excitations (or mean free path, whichever is shorter), then, in accordance with the quantum mechanics, quantum-size effects must be observed. In such an arrangement, lower energy photons that are not captured by the single bandgap material can be absorbed by the quantum well layers. The charge carriers produced in such a quantum well structure escape and add to the photocurrent output of the cell.

Figure 4A:
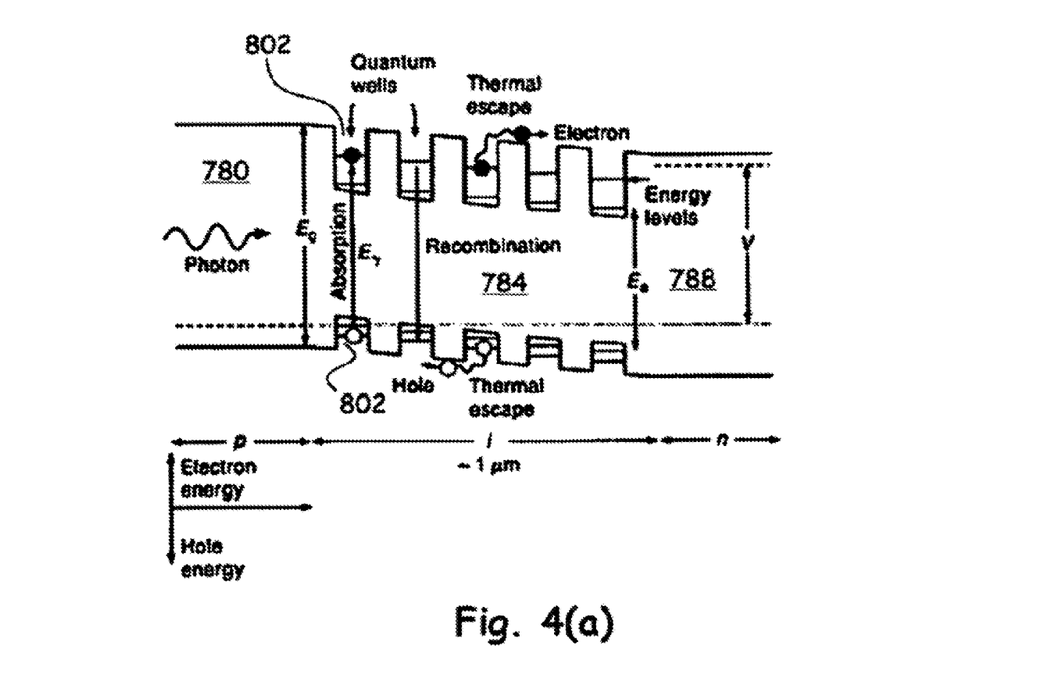
FIG. 4(a) shows an energy bandgap diagram to illustrate a quantum well solar device of the present invention.

FIG. 4(*a*) shows an energy bandgap diagram of a quantum well solar cell that utilizes such a mechanism so as to be adapted with any of the 6.1 Angstrom heterostructure arrangements as discussed above. The device, as shown in FIG. 4(*a*) is a p-i-n solar cell (p region 780, i region 784, and n region 788) with a multi-quantum well system 802 added to the intrinsic region (the "i" 784 in p-i-n). Because of the importance of lattice matching in solar cell operation, the material forming the quantum well with AlSb is beneficially lattice matched to AlSb. Such a quantum well matching with AlSb has been determined for high electron mobility transistor (HEMT) devices by M. J. Yang, "Photoluminescence of $InAs_{1-x}Sb_x$/AlSb single quantum wells: Transition from type-II to type-I band alignment," J. Appl. Phys., volume 87, No. 11, 8192 (2000). The composition of about $InAs_{0.82}Sb_{0.18}$ is reported to be lattice matched to AlSb to form lattice matched quantum wells that are more favorable for HEMT operation. In producing an AlSb quantum well solar cell device, an example composition of about $InAs_{0.82}Sb_{0.18}$ can be used to form lattice matched quantum wells within the intrinsic region of the AlSb p-n junction as represented in FIG. 4(*a*).

Quantum Dot Solar Cell

Figure 4B:
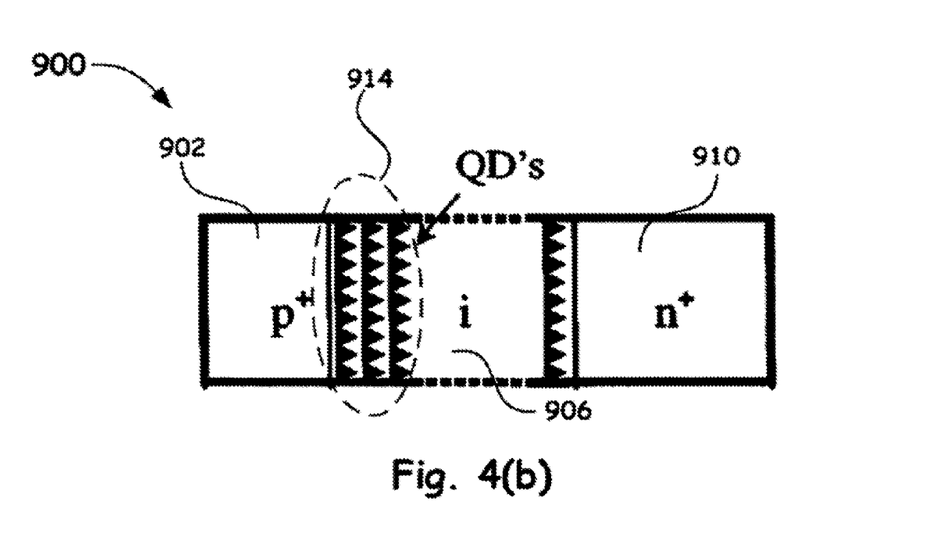
FIG. 4(b) illustrates a quantum dot solar cell.

Similar to the semiconductor p-i-n quantum well solar cell, as shown in FIG. 4(*a*) and as discussed above, the present invention can be arranged as a semiconductor p-i-n quantum dot solar cell. FIG. 4(*b*) shows a basic example of such a p-i-n cell (p region 902, i region 906, and n region 910), generally designated by the reference numeral 900, with multi-quantum dot layers 914 (e.g., as shown within the dashed ellipse) deposited in the intrinsic region 906.

In such an arrangement, a photon with sufficient energy will dislodge an electron from an atom in a dot, generating an electron-hole pair. Because the dots occupy so little space, electrons and holes get boxed in, or quantum-confined. Because of this confinement, an electron or hole liberated by a photon is restricted to a set of energy levels within the quantum dot. The smaller the dot, the wider apart the energy levels become and the greater the dot's energy bandgap. By controlling the dot size and density in the intrinsic region, the absorption of the lower energy photons is tuned in the present invention to increase the solar conversion efficiency. As an example material that can be utilized as quantum dots in the heterostructure arrangements discussed above, include, but are not limited to, InAs. InAs has a very low bandgap ($E_g$=0.36 eV), and accordingly, the size and shape of the InAs dots can be tuned to cover a range of bandgaps and thus a predetermined portion of the light absorption spectrum that are of particular importance for solar cells of the present invention. Specifically, because InAs (a=6.058 Å) is a member of the 6.1-Å family of semiconductors, single crystal AlSb materials as disclosed herein can be arranged as a working substrate to provide lattice matching for a quantum dot solar cell using, for example, InAs. However, because of the importance of lattice matching in the operation of solar cells, as in the case of AlSb quantum well solar cells, lattice matched quantum dots should be used in the AlSb quantum dot solar cell. Beneficial quantum dots as disclosed herein include, but is not limited to the compound of about $InAs_{0.82}Sb_{0.18}$ in the intrinsic region of AlSb to provide lattice matching.

In one general embodiment, a method for forming a non-conductive crystalline oxide layer on an aluminum antimonide (AlSb) crystal includes heat treating an AlSb crystal in a partial vacuum atmosphere at a temperature conducive for air adsorbed molecules to desorb, surface molecule groups to decompose, and elemental Sb to evaporate from a surface of the AlSb crystal and exposing the AlSb crystal to an atmosphere comprising oxygen to form a crystalline oxide layer on the surface of the AlSb crystal.

In another general embodiment, a method for forming a non-conductive crystalline oxide layer on an AlSb crystal includes heat treating an AlSb crystal in a non-oxidizing atmosphere at a temperature conducive for decomposition of an amorphous oxidized surface layer and evaporation of elemental Sb from a surface of the AlSb crystal and forming stable oxides of Al and Sb from residual surface oxygen to form a crystalline oxide layer on the surface of the AlSb crystal.

In yet another general embodiment, a semiconductor compound includes a crystal comprising AlSb and a non-conductive crystalline layer on the AlSb crystal.

According to another general embodiment, a semiconductor compound includes a crystal having an AlSb interior portion and a non-conductive crystalline layer defined by an extent of oxidation into the interior portion.

According to one embodiment, a thermal process to develop a crystalline oxide layer, which is predominantly an oxide of aluminum (Al), on single crystal AlSb is presented. Crystals of AlSb are heat treated in a partial vacuum atmosphere or in a partial oxygen atmosphere at a temperature conducive for air adsorbed molecules to desorb, surface molecule groups to decompose, and elemental Sb to evaporate from a surface of the AlSb crystal. In each case, the surface of the AlSb crystal becomes Al-rich by the Sb evaporation and the removal of hydrolyzation molecules, which produces a surface crystalline oxide layer that is non-conductive from either residual oxygen from decomposition of an adsorbed amorphous oxide layer or from the partial oxygen atmosphere. The presence of an amorphous oxide layer on the surface of the AlSb produced from (e.g., room temperature) air oxidation and/or from surface polishing is thereby converted to a very thin (e.g., on the order of several nm) crystalline oxide layer by this process, in several embodiments.

Figure 5:
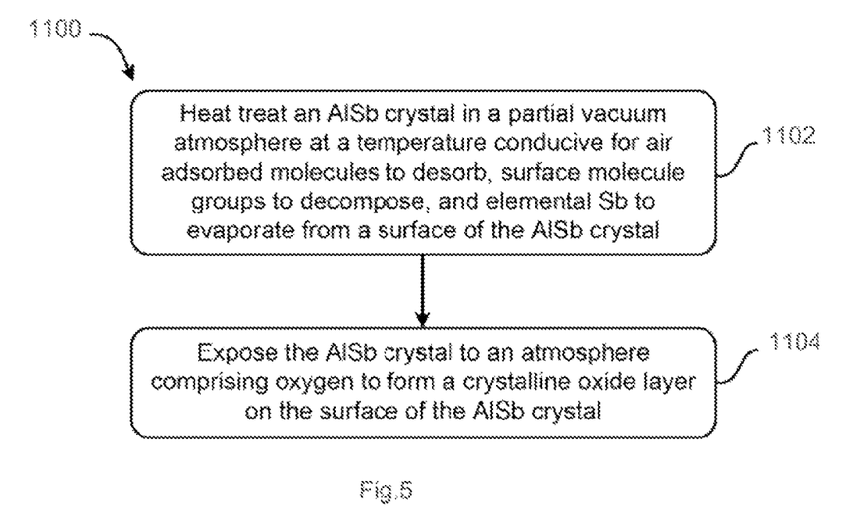
FIG. 5 shows a flowchart of a method of formation of a crystalline oxide layer, in accordance with one embodiment.

In one preferred embodiment, as shown in FIG. 5, a method 1100 for forming a non-conductive crystalline oxide layer on an AlSb crystal is disclosed. The method 1100 may be carried out in any desired environment, and may include steps or operations not described herein. Additionally, the operations described below may be modified and/or implemented in a manner different than those described herein, as would be known to one of ordinary skill in the art.

In operation 1102, an AlSb crystal is heat treated in a partial vacuum atmosphere at a temperature conducive for Sb evaporation from a surface of the AlSb crystal. In some embodiments, the AlSb crystal may have a volume of at least about 1 cm$^3$. This size of crystal ensures that it may be used in a broad range of applications after formation of the crystalline layer thereon, such as using the crystal as a semiconductor, as an alpha-particle detector, as a radiation detector, etc. Of course, the crystals produced through method 1100 may be larger or smaller, and a volume of 1 cm$^3$ is an illustrative value only.

Temperatures which are conducive to decomposition of air adsorbed hydroxidation and hydration molecules and evaporation of Sb from a surface of the AlSb crystal range from about 350° C. (which is about the temperature for decomposition of Al and Sb hydroxidation and hydration molecules and where Sb begins to evaporate from the AlSb crystal) to about 650° C. (which is about the temperature where $Sb_2O_5$ decomposes to the stable oxide $Sb_2O_3$).

According to one embodiment, the partial vacuum atmosphere comprises no $O_2$. In a further embodiment, the partial vacuum atmosphere also or alternatively comprises no $N_2$. The partial vacuum atmosphere may have a partial vacuum pressure in a range from about 0.01 atm to about 0.99 atm, about 0.1 atm to about 0.9 atm, about 0.3 atm to about 0.7 atm, etc., in several embodiments.

In operation 1104, the AlSb crystal is exposed to an atmosphere comprising oxygen to form a crystalline oxide layer on the surface of the AlSb crystal. What is meant by an atmosphere comprising oxygen is that the atmosphere includes $O_2$ or some other oxidant known in the art, and is conducive to oxide formation at a surface of the crystal. For example, in one approach, the atmosphere may contain only $O_2$ and no other gases, particularly $N_2$. In another approach, the atmosphere may include one or more inert gases, such as Ar, Ne, etc., and some amount of $O_2$ or oxidant, wherein the amount of $O_2$ or oxidant present may impact the speed and thickness of the crystalline oxide layer formation. In another approach, the atmosphere may include $O_2$ or oxidant and one or more gases nonreactive with AlSb, Al, and Sb. Other approaches of exposing the crystal to oxygen are also possible, as would be known to one of skill in the art.

In one embodiment, the AlSb crystal may be exposed to the atmosphere comprising oxygen for a period of between about 5 minutes and about 10 minutes. Of course, the length of time of exposure to the atmosphere may impact the thickness of the crystalline oxide layer, in some approaches. Other factors may also impact the thickness, such as partial vacuum pressure, temperature, etc. Any and/or all of the known factors which may impact the thickness of the crystalline oxide layer may be controlled and/or accounted for when forming the crystalline oxide layer to more effectively control the thickness of the crystalline oxide layer, in many approaches.

In another embodiment, the crystalline oxide layer may have a thickness of less than about 10 nm in a direction perpendicular to a plane of formation of the crystalline oxide layer. This thickness range limits the effect that the crystalline oxide layer has on the performance of the crystal/crystalline oxide layer composite in future applications, such as semiconductor applications.

According to one approach, the crystalline oxide layer may comprise predominantly $Al_2O_3$ at a surface thereof. X-ray photoelectron spectroscopy (XPS) showed surface oxide composition to be $Al_2O_3$ and $Sb_2O_3$ with no presence of elemental Sb. By predominantly, what is indicated is that the surface of the crystalline oxide layer may have at least 99% $Al_2O_3$, at least 90% $Al_2O_3$, at least 80% $Al_2O_3$, at least 51% $Al_2O_3$, etc. Of course, oxide formation is not always guaranteed, even under extremely stringent conditions; therefore, it is intended that the surface of the crystalline oxide layer should include as much $Al_2O_3$ as possible under the formation techniques presented herein. As the percentage of $Al_2O_3$ at the surface of the crystalline oxide layer decreases, the oxidation barrier protection which this layer provides to the AlSb crystal also decreases.

According to one embodiment, to expedite the formation of the crystalline oxide layer, the AlSb crystal may be exposed to the atmosphere comprising oxygen while under partial vacuum pressure, as described earlier. In an alternate embodiment, the AlSb crystal may be exposed to the atmosphere comprising oxygen while under ambient pressure, e.g., about 1 atm.

Figure 6:
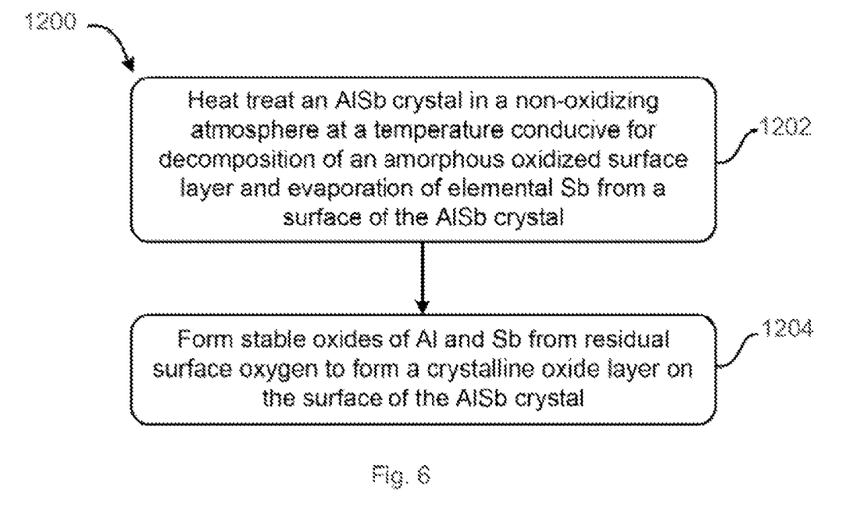
FIG. 6 shows a flowchart of a method of formation of a crystalline oxide layer, in accordance with one embodiment.

In one preferred embodiment, as shown in FIG. 6, a method 1200 for forming a non-conductive crystalline oxide layer on an AlSb crystal using a non-oxidizing gas, such as argon and/or nitrogen, is disclosed. The method 1200 may be carried out in any desired environment, and may include steps or operations not described herein. Additionally, the operations described below may be modified and/or implemented in a manner different than those described herein, as would be known to one of ordinary skill in the art.

In operation 1202, an AlSb crystal is heat treated in an atmosphere of a non-oxidizing gas at a temperature conducive for decomposition of Al and Sb hydroxidation and hydration molecules and Sb evaporation from a surface of the AlSb crystal. The non-oxidizing gas may be nitrogen, argon, neon, etc., in various embodiments. As a result of the heat treating, a non-conductive crystalline oxide layer may be formed directly from the residue oxygen from decomposition of the Al and Sb hydroxidation and hydration molecules, in one embodiment. In more embodiments, the AlSb crystal may have a volume of at least about 1 cm$^3$. This size of crystal ensures that it may be used in a broad range of applications after formation of the crystalline layer thereon, such as using the crystal as a semiconductor, as an alpha-particle detector, as a radiation detector, etc. Of course, the crystals produced through method 1200 may be larger or smaller, and a volume of 1 cm$^3$ is an illustrative value only.

When nitrogen is used, a heat treatment temperature may be a temperature that is below the temperature at which AlN forms, in preferred embodiments.

Temperatures which are conducive to decomposition of air adsorbed hydroxidation and hydration molecules and evaporation of Sb from a surface of the AlSb crystal range from about 350° C. (which is about the temperature for decomposition of Al and Sb hydroxidation and hydration molecules and where Sb begins to evaporate from the AlSb crystal) to about 650° C. (which is about the temperature where $Sb_2O_5$ decomposes to the stable oxide $Sb_2O_3$). This range of temperature is below that required for AlN formation (liquid Al reacts with nitrogen gas to form AlN solid at a temperature of about 830° C.). X-ray photoelectron spectroscopy (XPS) showed surface oxide composition to be $Al_2O_3$ and $Sb_2O_3$ with no presence of elemental Sb or AlN.

In operation 1204, stable oxides of Al and Sb are formed from residual surface oxygen to form a crystalline oxide layer on the surface of the AlSb crystal.

In one embodiment, the AlSb crystal may be exposed to the non-oxidizing atmosphere for a period of between about 5 minutes and about 10 minutes. Of course, the length of time of exposure to the atmosphere may impact the thickness of the resulting crystalline oxide layer, in some approaches. Other factors may also impact the thickness, such as partial vacuum pressure, temperature, etc. Any and/or all of the known factors which may impact the thickness of the crystalline oxide layer may be controlled and/or accounted for when forming the crystalline oxide layer to more effectively control the thickness of the crystalline oxide layer, in many approaches.

In another embodiment, the crystalline oxide layer may have a thickness of less than about 10 nm in a direction perpendicular to a plane of formation of the crystalline oxide layer.

According to one approach, the crystalline oxide layer may comprise predominantly $Al_2O_3$ at a surface thereof. By predominantly, what is indicated is that the surface of the crystalline oxide layer may have at least 99% $Al_2O_3$, at least 90% $Al_2O_3$, at least 80% $Al_2O_3$, at least 51% $Al_2O_3$, etc. Of course, oxide formation is not always guaranteed, even under extremely stringent conditions; therefore, it is intended that the surface of the crystalline oxide layer should include as much as $Al_2O_3$ as possible under the formation techniques presented herein. As the percentage of $Al_2O_3$ at the surface of the crystalline oxide layer decreases, the oxidation barrier protection which this layer provides to the AlSb crystal also decreases.

According to one embodiment, to expedite the formation of the crystalline oxide layer, the AlSb crystal may be exposed to the non-oxidizing atmosphere, such as one comprising nitrogen, argon, neon, etc., while under partial vacuum pressure, as described earlier. In an alternate embodiment, the AlSb crystal may be exposed to the non-oxidizing atmosphere while under ambient pressure, e.g., about 1 atm.

Figure 7:
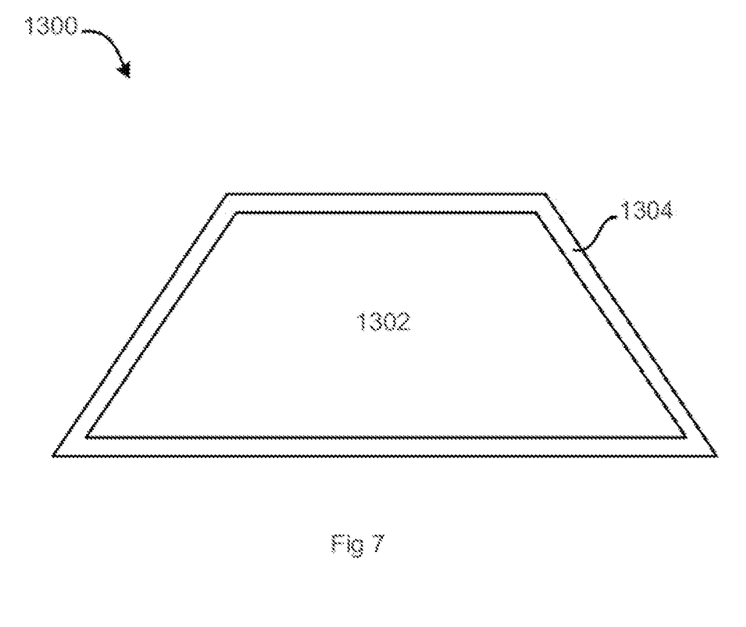
FIG. 7 shows a semiconductor compound, according to one embodiment.

Now referring to FIG. 7, according to another preferred embodiment, a semiconductor compound 1300 includes a crystal 1302 comprising AlSb and a non-conductive crystalline layer 1304 on the AlSb crystal. By "on the AlSb crystal," in one embodiment, what is meant is that the non-conductive crystalline layer 1304 exhibits characteristics of having been formed from the crystal 1302, e.g., by oxidation of the crystal. Thus, the interface between the non-conductive crystalline layer 1304 and the crystal 1302 may have characteristics of an oxidation front created during formation of the non-conductive crystalline layer 1304. In another embodiment, "on the AlSb crystal" indicates that the non-conductive crystalline layer 1304 exists at a surface of the crystal 1302, with no intervening layers between the crystal 1302 and the non-conductive crystalline layer 1304.

In some embodiments, the AlSb crystal may have a volume of at least about 1 cm$^3$. This size of crystal ensures that it may be used in a broad range of applications after formation of the crystalline layer thereon, such as using the crystal as a semiconductor, as an alpha-particle detector, as a radiation detector, etc. Of course, the crystal 1302 may be larger or smaller, and a volume of 1 cm$^3$ is an illustrative value only.

In another embodiment, the crystalline layer may have a thickness of less than about 10 nm in a direction perpendicular to a plane of formation of the crystalline layer, for reasons indicated earlier.

In one approach, the crystalline layer may be a crystalline oxide layer comprising predominantly $Al_2O_3$ at a surface thereof, for reasons described above.

In one embodiment, an interface between the crystal and the crystalline layer may be physically characterized by an extent of oxidation of a portion of the crystal from an outer surface thereof inward. This may be caused by formation of the crystalline layer according to one of method 1100 and/or method 1200, as described above.

In another embodiment, the crystalline layer may be characterized by a substantial or complete absence of antimony (Sb) therein, particularly at an outer surface thereof. This may be caused by heat treatment of the AlSb crystal, as described in methods 1100 and 1200, above.

In more embodiments, an oxidation front that is characteristic of oxidation of an outer portion of the crystal may separate the crystalline layer from the crystal. According to one approach, as described in methods 1100 and/or 1200, as the outer layers of the crystal become oxidized in their respective atmospheres, an interface (oxidation front) may develop between the portion of the crystal which has already become oxidized (the crystalline layer) and the remaining portion of the crystal. This interface may impart certain characteristics onto the compound.

In one approach, a ratio of Al to Sb in the crystalline layer may be higher than a ratio of Al to Sb in the crystal. This may be due in part to evaporation of the Sb from the outer surfaces of the crystal prior to oxidation or nitridation, as described in methods 1100 and/or 1200.

A semiconductor compound, according to another embodiment, includes a crystal having an aluminum antimonide (AlSb) interior portion and a non-conductive crystalline layer defined by an extent of oxidation or nitridation into the interior portion. In some embodiments, a ratio of Al to Sb in the crystalline layer may be higher than a ratio of Al to Sb in the interior portion.

The development of a non-conductive oxide surface for an AlSb semiconductor compound enables its application as an alpha-particle detector, radiation detector, and, of particular importance, as a substrate for revolutionary new low-noise, low-power, high-speed electronic antimonide/arsenide heterostructure devices, among many other uses and applications.

Figure 8A:
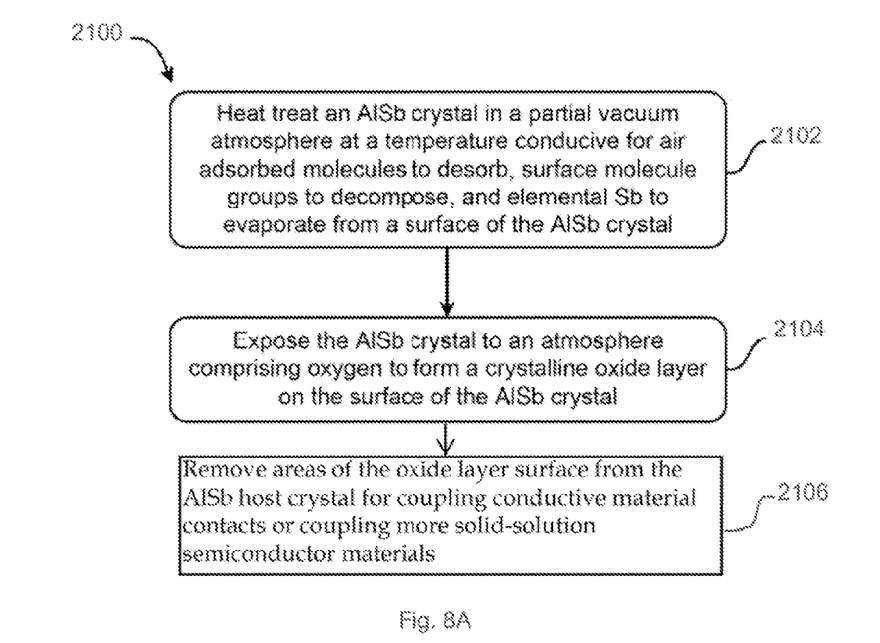
FIG. 8A shows a flowchart of a method, in accordance with one embodiment.

FIG. 8A describes a method 2100 for producing a solar cell. Step 2101 heat treats an AlSb crystal in a partial vacuum atmosphere at a temperature conducive for air adsorbed molecules to desorb, surface molecule groups to decompose, and elemental Sb to evaporate from a surface of the AlSb crystal. Step 2104 exposes the AlSb crystal to an atmosphere comprising oxygen to form a crystalline oxide layer on the surface of the AlSb crystal. Step 2106 removes areas of the oxide layer surface from the AlSb host crystal for coupling conductive material contacts or coupling more solid-solution semiconductor materials.

Figure 8B:
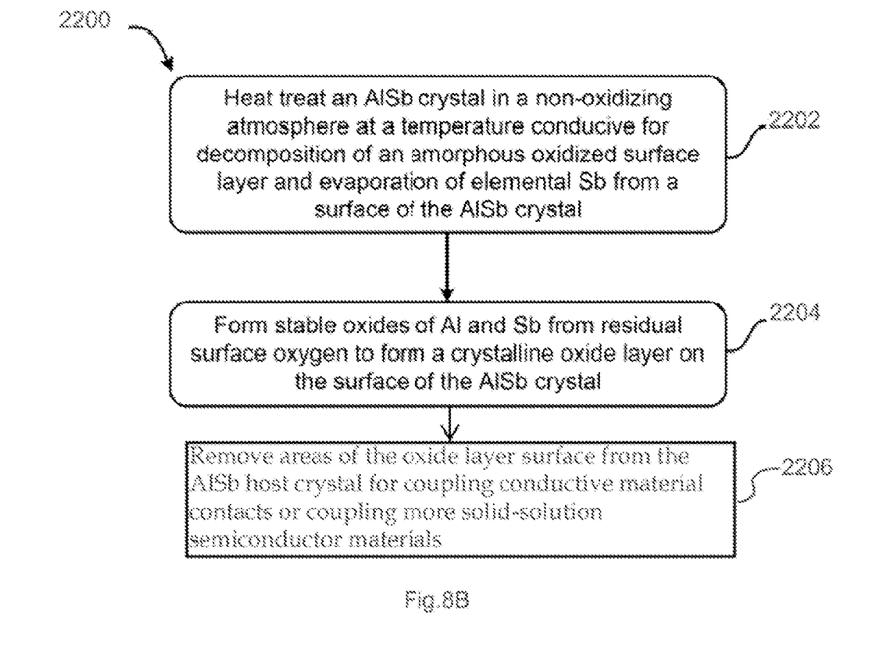
FIG. 8B shows a flowchart of a method, in accordance with one embodiment.

FIG. 8B describes a method 2200 for producing a solar cell. Step 2202 heat treats an AlSb crystal in a non-oxidizing atmosphere at a temperature conducive for decomposition of an amorphous oxidized surface layer and evaporation of elemental Sb from a surface of the AlSb crystal. Step 2204 forms stable oxides of Al and Sb from residual surface oxygen to form a crystalline oxide layer on the surface of the AlSb crystal. Step 2206 removes areas of the oxide layer surface from the AlSb host crystal for coupling conductive material contacts or coupling more solid-solution semiconductor materials.

It is to be understood that the number of semiconductor layers and the variations disclosed herein are not limited to these numbers of layers and/or variations. While the example arrangements of the invention are described, various modifications may be made in such arrangements to cover all modifications, equivalents, and alternatives falling within the spirit and scope of the invention as defined by the following appended claims.

We claim:

1. A method for producing a solar cell, comprising:
providing a controlled atmospheric annealed single crystal AlSb substrate material by (i) producing a heat treated AlSb crystal by heat treating an AlSb host crystal in a partial vacuum atmosphere at a temperature conducive for air adsorbed molecules to desorb, one or more surface molecule groups to decompose and elemental Sb to evaporate from a surface of the AlSb crystal, (ii) exposing said heat treated AlSb crystal to an atmosphere comprising oxygen to form a crystalline oxide layer on the surface of the AlSb crystal; and (iii) removing areas of said oxide layer from said AlSb host crystal to enable coupling of conductive material contacts or coupling more solid-solution semiconductor materials to said host crystal, wherein said controlled atmospheric annealed single crystal. AlSb substrate material has a substantially uniform resistivity of less than about 10 Ω·cm and is utilized as an active host layer; and
coupling one or more solid-solution semiconductor materials with said controlled atmospheric annealed single crystal AlSb active host layer, wherein each of said one or more solid-solution semiconductor materials further comprise a lattice parameter so as to produce a substantially lattice-matched configuration.

2. The method of claim 1, wherein said temperature is from about 350° C. to about 650° C.

3. The method of claim 1, wherein said partial vacuum atmosphere comprises no oxygen.

4. The method of claim 1, wherein the step of exposing comprises exposing said heat treated AlSb crystal to an atmosphere comprising oxygen for a period of between about 5 minutes and about 10 minutes.

5. The method of claim 1, wherein said controlled atmospheric annealed single crystal AlSb has a volume of at least about 1 cm³.

6. The method of claim 1, wherein said crystalline oxide layer has a thickness of less than about 10 nm in a direction perpendicular to a plane of formation of said crystalline oxide layer.

7. The method of claim 1, wherein said crystalline oxide layer comprises predominantly $Al_2O_3$ at a surface thereof.

8. The method of claim 1, wherein said controlled atmospheric annealed single crystal AlSb crystal is exposed to the atmosphere comprising oxygen while under partial vacuum pressure.

9. The method of claim 1, wherein the AlSb crystal is exposed to the atmosphere comprising oxygen while under ambient pressure.

10. The method of claim 1, wherein the AlSb crystal is exposed to the atmosphere comprising oxygen while being heat treated.

11. The method of claim 1, wherein said substantially lattice matched configuration comprises less than about a 0.01% lattice mismatch.

12. The method of claim 1, wherein said one or more solid-solution semiconductor materials comprise at least two materials selected from the group consisting of Aluminum Antimonide (AlSb), Gallium Antimonide (GaSb), Indium Antimonide (InSb), Indium Arsenide (InAs), Zinc Telluride (ZnTe) and Cadmium Telluride (CdTe).

13. The method of claim 1, wherein said one or more solid-solution semiconductor materials comprise binary compounds and/or related ternary and quaternary alloys.

14. The method of claim 1, wherein said one or more solid-solution semiconductor materials comprise predetermined thicknesses so as to provide substantially an equal amount of current.

15. The method of claim 1, wherein said one or more solid-solution semiconductor materials further comprise epitaxy layers.

16. The method of claim 1, further comprising at least one arrangement selected from the group consisting of antireflection coatings, buffer layers, ohmic contacts, tunnel junctions and passivation layers.

17. The method of claim 16, wherein said buffer layers are arranged so as to provide electrical isolation and/or surface smoothing.

18. The method of claim 1, wherein said solar cell comprises a heterostructure.

19. The method of claim 18, wherein said heterostructure further comprises a top layer having a larger bandgap than the bottom layer.

20. The method of claim 1, wherein said solar cell comprises a quantum device selected from the group consisting of a quantum well solar cell and a quantum dot solar cell.

21. The method of claim 1, wherein said solar cell comprises a multi-junction solar cell.

22. The method of claim 21, wherein said multi-junction solar cell further comprises a stack of individual single-junction cells in descending order of bandgap.

23. The method of claim 1, wherein said controlled atmospheric annealed host layer comprises an n- or p-type host layer.

24. The method of claim 1, wherein said one or more solid-solution semiconductor materials comprises an n- or p-type material.

25. The method of claim 1, wherein said solid-solution semiconductor materials comprise substantially lattice matched materials selected from the III-V 6.1 Angstrom family of materials.

26. The method of claim 1, wherein said solid-solution semiconductor materials comprise substantially lattice matched materials selected from the II-VI family of materials.

27. A method for producing a solar cell, comprising:
providing a controlled atmospheric annealed single crystal AlSb substrate material by (i) heat treating an AlSb host crystal in a non-oxidizing atmosphere at a temperature conducive for decomposition of an amorphous oxidized surface layer and evaporation of elemental Sb from a surface of the AlSb crystal to produce a heat treated AlSb crystal, (ii) forming stable oxides of Al and Sb from residual surface oxygen to form a crystalline oxide layer on the surface of said heat treated AlSb crystal, and (iii) removing areas of said oxide layer from AlSb host crystal for coupling conductive material contacts or coupling more solid-solution semiconductor materials, wherein said controlled atmospheric annealed single crystal AlSb substrate material has a substantially uniform resistivity of less than about 10 $\Omega \cdot$cm and is utilized as an active host layer; and
coupling one or more solid-solution semiconductor materials with said controlled atmospheric annealed single crystal AlSb substrate material, wherein each of said one or more solid-solution semiconductor materials further comprise a lattice parameter so as to produce a substantially lattice-matched configuration.

\* \* \* \* \*